United States Patent [19]

Tsai

[11] Patent Number: 5,670,432
[45] Date of Patent: Sep. 23, 1997

[54] THERMAL TREATMENT TO FORM A VOID FREE ALUMINUM METAL LAYER FOR A SEMICONDUCTOR DEVICE

[75] Inventor: Chau-Jie Tsai, Hsin-Chu, Taiwan

[73] Assignee: Taiwan Semiconductor Manufacturing Company, Ltd., Hsin-Chu, Taiwan

[21] Appl. No.: 691,079

[22] Filed: Aug. 1, 1996

[51] Int. Cl.$^6$ ................................................ H01L 21/465
[52] U.S. Cl. ........................... 437/245; 427/99; 437/195; 437/241
[58] Field of Search ...................... 437/241, 245, 437/196; 427/99

[56] References Cited

U.S. PATENT DOCUMENTS 5,019,533  5/1991  Cuddihy et al. ......................... 437/199
5,166,095  11/1992  Hwang ..................................... 437/188

Primary Examiner—Charles L. Bowers, Jr.
Assistant Examiner—Vanessa Acosta
Attorney, Agent, or Firm—George O. Saile; William J. Stoffel

[57] ABSTRACT

The present invention provides a method of manufacturing a void free, reduced stress aluminum layer and an overlying silicon nitride layer on a substrate, comprising: forming a gate oxide layer 12 over said substrate, forming a polysilicon layer 14 over said gate oxide layer 12; forming a polyoxide layer 16 over said polysilicon layer 14; forming a first insulating layer 18 composed of silicon nitride over said polyoxide layer 16; forming an aluminum alloy layer 20 over said first insulating layer; forming a silicon nitride layer 24 over said aluminum alloy layer 20 by ramping said substrate from room temperature up to between about 345° and 355° C., at a pressure between about 2200 and 2500 m torr, in a $N_2$ ambient, for time of between about 3 and 8 minutes; and ramping the temperature down to between 315° and 325° C. and depositing silicon nitride over said aluminum layer at a temperature of between about 315° and 325° C.

25 Claims, 3 Drawing Sheets

THERMAL TREATMENT TO FORM A VOID FREE ALUMINUM METAL LAYER FOR A SEMICONDUCTOR DEVICE

BACKGROUND OF INVENTION

1) Field of the Invention

This invention relates generally to fabrication of a metal layer for semiconductor devices and particularly to a method of forming a metal layer with a large capacitance area for a semiconductor device and more particularly to a method of forming a void free aluminum layer and an overlying silicon nitride layer in a semiconductor device.

2) Description of the Prior Art

A critical reliability problem effecting silicon integrate circuits (IC) is voids which develop in the aluminum metallization deposited on the surface of a chip. The metal provides interconnections between devices. These voids often occur at the edge of a conductor and can extend across the entire width of the conductor thus causing an open circuit failure. When voids occur only part way across, there is a concern that the voids could lead to a time dependent failure condition when the chip is electrically functional. Another concern is thought to be that residual stresses in the aluminum metallization conductor could cause further time dependent propagation of the void even when not electrically operational.

CMOS semiconductor product chip often suffer metal void problems in large capacitance areas. The large capacitance area often works as a normal IC device capacitor function. The large capacitance area is often comprises an aluminum:silicon (Al:Si) alloy layer which covers a large chip area. The Al:Si layer is often formed by a conventional sputter process. The metal void problem is often caused by stress, especially stress from underlying and overlying insulating layers. The large capacitance area acerbates the stress problem causing more metal voids.

U.S. Pat. No. 5,019,533 (Cubbihy et al.) shows a method of healing voids in aluminum metallization conductors on a chip after the chip is subjected to a thermal treatment at a high temperature sufficient to allow diffusion of silicon by rapidly cooling the chip, preferably by immersion of the chip in liquid nitrogen. U.S. Pat. No. 5,166,095 (Hwang) teaches a process to reduce Metal 1 (M1)/N+ contact resistance including a low temperature anneal step after the aluminum interconnect is alloyed at 400° C. However, these and other prior art processes do not completely solve the metal void problem and can be improved upon.

The prior art process do not adequately solve the problem of metal voids in the aluminum layer. Therefore an improved metalization process is need which will reduce metal voids formed in metal layers, especially voids formed in metal layer formed over insulating layers and metal layers in high capacitance areas.

SUMMARY OF THE INVENTION

It is an object of the present invention to provide a method for fabricating a void free, reduced stress, aluminum layer over a semiconductor substrate.

It is an object of the present invention to provide a method for fabricating a void free, reduced stress, aluminum layer in a structure comprising: an underlying silicon nitride layer, an aluminum silicide layer, and an overlying silicon nitride layer.

To accomplish the above objectives, the present invention provides a method of fabricating a void free aluminum alloy layer. The process comprises: forming a first insulating layer composed of silicon nitride over a substrate surface; forming an aluminum alloy layer over the first insulating layer; and forming a silicon nitride layer over the aluminum alloy layer by ramping the substrate from room temperature up to a temperature between about 340° and 360° C., at a pressure between about 2000 to 2500 m torr, in a $N_2$ ambient; and then ramping the temperature down to between 317° and 323° C. and depositing silicon nitride over the aluminum layer at a temperature of between about 315° C. and 325° C.

The present invention is a process that reduces the voids formed in an aluminum alloy layer and overlying silicon nitride (SiN) layer. The invention is an insitu heat treatment at the beginning of the overlying SiN layer deposition process. The heat treatment and SiN process of the invention involves ramping the temperature up and pre-annealing (e.g., thermally treating) the wafer at a temperature of about 350° C. before ramping down to deposit SiN at a temperature of about 320° C. using a plasma enhanced process. The anneal and ramp down steps significantly reduce the stress on the aluminum alloy layer from the underlying insulating (e.g., SiN) layer and the overlaying PE-SiN layer. This stress reduction greatly reduces the number and size of voids in the aluminum alloy layer. By reducing void formation, the invention significantly improves device reliability.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
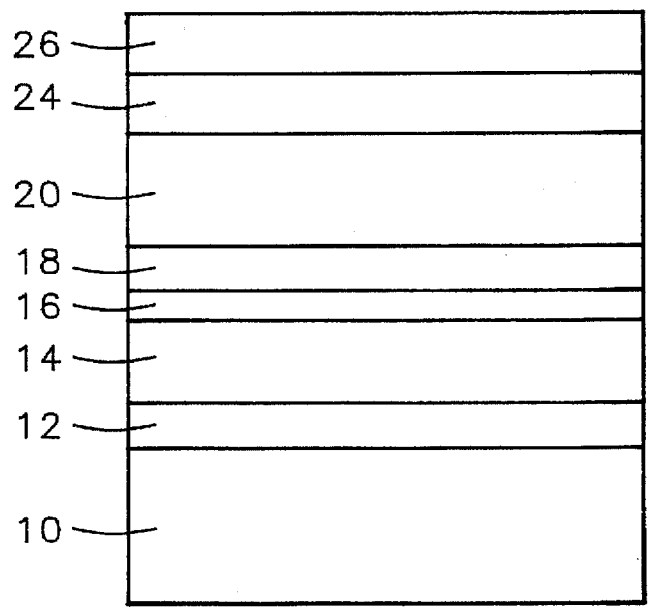
FIG. 1 is a cross sectional view for illustrating a method for manufacturing a metal structure according to the present invention.

The present invention will be described in detail with reference to the accompanying drawings. Referring to FIG. 1, a semiconductor wafer 10 is provided. The substrate is preferably formed of silicon having a crystal orientation of (100). Substrate 10 is understood to possibly include a silicon semiconductor wafer, active and passive devices formed within the wafer. The term "substrate" is mean to include devices formed within a semiconductor wafer (e.g., source, drain, wells, etc.) and the layers overlying the wafer, such as conductive and insulating layers (e.g., oxide and polysilicon layers). The term "substrate surface" is meant to include the upper most exposed layers on a semiconductor wafer, such as a silicon surface, an insulating layer and metallurgy lines. The substrate can be a product of processes which deposit insulating and conductive layers over the wafer.

Next a gate oxide layer 12 is formed over the substrate 10. See FIG. 1. The gate oxide layer 12 is preferably formed of silicon oxide and is formed by a thermal oxidation process or a chemical vapor deposition process. The gate oxide layer is preferably formed by a wet thermal oxidation at a temperature in a range between about 919° and 921° C. The gate oxide layer preferably has a thickness in a range of between about 320 and 380 Å and more preferably about 350 Å.

A polysilicon layer 14 is then formed over the gate oxide layer 12. The polysilicon layer preferably has a thickness in a range of between about 2900 and 3400 Å and more preferably a thickness of about 3150 Å. The polysilicon layer can be deposited by pyrolyzing silane in a low pressure chemical vapor deposition process at a temperature between about 627° and 633° C. Layer 14 can be used to store electrical charge in a circuit.

A polyoxide layer 16 is then formed over said polysilicon layer 14. The polyoxide layer 18 has a thickness in a range of between about 220 and 280 Å and more preferably about 250 Å. The polyoxide is preferably formed by thermally oxidizing the polysilicon layer 16 at a temperature in a range of between about 919° and 921° C. The polyoxide layer 16 can be used as an insulator/dielectric similar to silicon nitride layer 18.

A silicon nitride layer 18 is then formed over the polyoxide layer 16. The silicon nitride layer 18 can be formed by reacting silane and ammonia at atmospheric pressure at 700° to 900° C., or by reacting dichlorosilane and ammonia at reduced pressure of between about 200 and 300 mtorr and a temperature in a range of about 730° and 830° C. and more preferably about 700° C. The silicon nitride layer is preferably formed using a low pressure chemical vapor deposition (LPCVD) process.

Also, silicon nitride can be formed by plasma enhance chemical vapor deposition by reacting silane with ammonia or nitrogen in a glow discharge between 200° and 350° C. The silicon nitride layer 18 preferably has a thickness in a range of between about 540 and 660 Å and more preferably about 600 Å. Stress from a silicon nitride layer 18 is thought to contribute to the stress and void problem in a subsequent overlying Al:Si layer 20.

An aluminum alloy layer 20 is then formed over said silicon nitride 18. The aluminum alloy layer may also contain a minor amount (less than 3% by weight) of a metal selected from the group consisting of cooper, silicon, titanium, tungsten and mixtures thereof. The aluminum alloy layer 20 preferably an alloy of aluminum and silicon with a weight % between about 0.5 and 2.0 wt % silicon. The aluminum alloy layer 20 preferably has a thickness in a range of between about 10,000 and 12,000 Å and more preferably about 11,000 Å.

The aluminum alloy layer is preferably deposited by a sputter, bombarding a metal ingot with plasma. Other metal deposition processes are also suitable. The metal target can be an ingot comprising about 97.5 to 99.5% Al and 0.5 to 2.5% Silicon and more preferably about 1% wt silicon. The aluminum which is vaporized by the plasma is deposited on the semiconductor surface. The aluminum alloy layer 20 can be sputter deposited from a single target containing Al and Silicon, at an energy of between about 9.5 and 10.0 kW, at a wafer temperature of between about 150° and 160° C., gas ambient of Argon and at a pressure of between about 1E-3 to 6E-3 torr, voltage range 480 between 650 V and a DC power supply. The sputter tool can be a model MS 6210 sputter made by Electro-TEC, England.

The excess metal is etched away from the semiconductor surface to define the metal lines and other areas. The aluminum silicon alloy layer preferably has a large capacitance area with length and width in a range of about 200 and 600 μm; and more preferably a length of about 250 μm and a width of about 200 μm.

Figure 2:
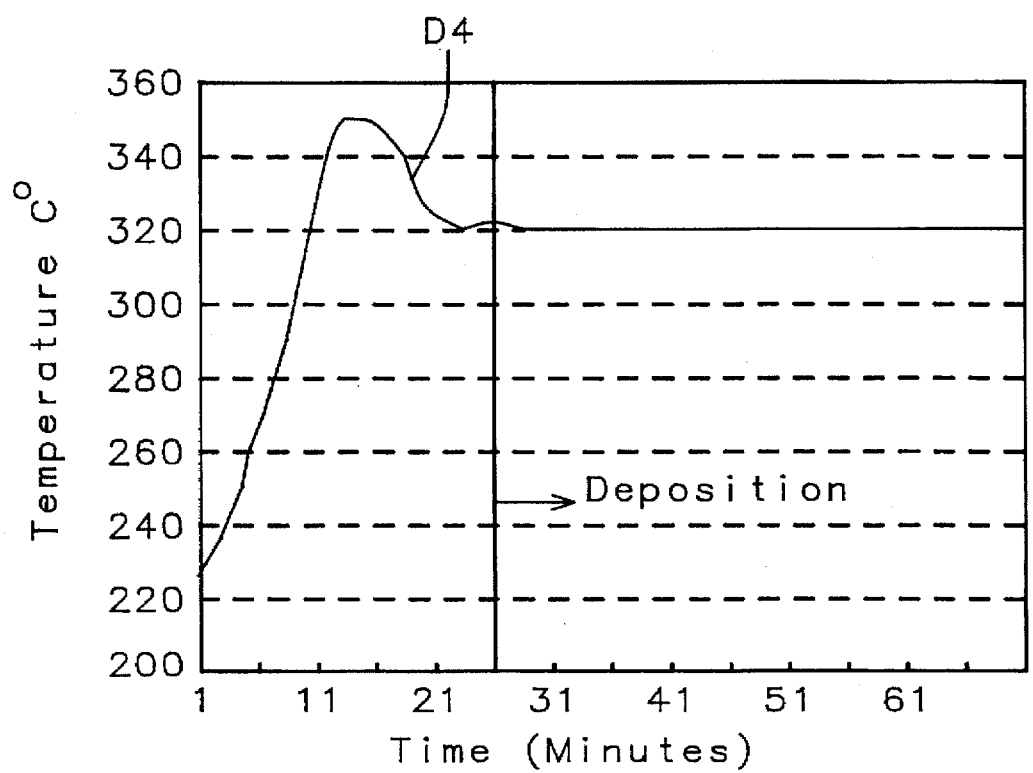
FIG. 2 is a graph of the insitu pre-anneal and PE-SiN deposition process of the present invention.

In a critical step in the invention, an insulating layer composed of silicon nitride layer 24 (e.g., plasma enhanced silicon nitride (PE-SiN)) is formed over said aluminum alloy layer 20. The silicon nitride layer is preferably formed using a plasma enhanced chemical vapor deposition (PECVD) process where the first step in the process is an in-situ high temperature treatment (e.g., stress removal step, pre-anneal) of the aluminum alloy layer 20. As shown in FIG. 2, the process begins by ramping the substrate from room temperature up to between about 345° and 355° C. and more preferably about 350° C., at a pressure between about 2200 to 2500 mtorr and more preferably about 2350 mtorr, in a $N_2$ ambient, for time of between about 3 and 8 minutes and more preferably about 5 minutes. D4 represents the thermal cycle. Also see table 1 below. The temperature is then ramped down to between 315° and 325° C. and more preferably about 320° C., and where silicon nitride is deposited by PECVD over the aluminum layer 20 at a temperature of between about 315° and 325° C. and more preferably about 320° C. Deposition begins at a time between about 23 to 29 minutes after the start and more preferably at about 26 minutes. The pressure preferably remains between about 2200 to 2500 m torr. The SiN PE-CVD deposition preferably reacts $SiH_4$ and $N_2O$ in an argon plasma in a batch type system, more preferably an ASM plasma III batch type system, at a discharge frequency in a range of about 440 and 460 Khz and a power in a range of about 2500 and 3100 W, and more preferably about 2800 W; electrode spacing in a range of about 1.7 and 1.9 cm, total pressure in a range of about 2200 and 2500 mtorr and more preferably about 2300 torr; and a substrate temperature in a range of about 315° and 325° C.; and more preferably about 320° C. The PECVD tool is preferably a Plasma III model manufactured by ASM. The PE SiN layer 24 causes additional stress in the Al:Si layer 20. The PE-SiN layer 24 is a passivation layer and barrier layer for moisture and mobile ions.

The ramp-up and heat treatment before SiN deposition of the present invention is critical to reducing the stress in the underlying Al:Si layer 20. Annealing the wafer after the Al:Si layer 24 deposition would not reduce the stress as the stress is caused during the ramp-up and deposition of the SiN layer 24. Experiments show that the separate annealing of the wafer at temperatures, including 410° C., do not reduce the metal void problem.

Subsequently, a passivation layer 26 is formed over the silicon nitride layer 24. See FIG. 1. The passivation layer is preferably composed of phosphosilicate glass (PSG) having a Phosphorous content in a range of between about 1 and 4 weight % and more preferably 3%. The PSG layer can be formed using a plasma enhanced chemical vapor deposition (PECVD) process by the reaction of SiH4, N2, $O_2$ and $Ph_3$ with Ar as a carrier gas. The PSG layer is preferably formed in a LPCVD process by using $SiH_4$ and $PH_3$.

Figure 5:
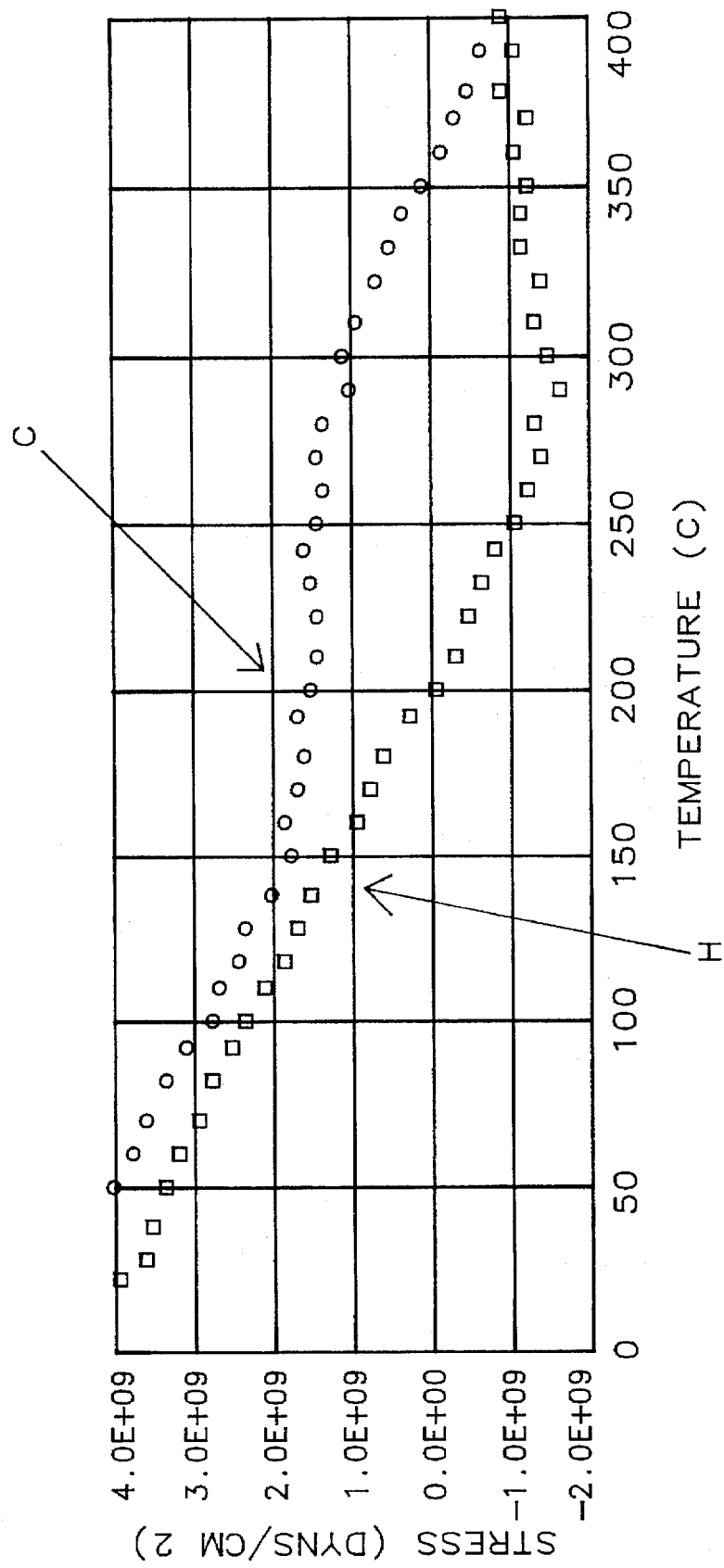
FIG. 5 is a graph showing the relationship between metal layer stress and temperature for heating (H) and cooling (C) the metal layer.

FIG. 5 shows the stress of the AlSiCu as a function of the wafer temperature prior to SiN deposition. The curve labeled H is the heating curve, and the curve labeled C is the cooling curve.

Experimental Results

Table 1 shows the results of a split lot experiment where the thermal cycle temperature prior to PE-SiN deposition (e.g., layer 24) was varied.

TABLE 1

Figure 4:
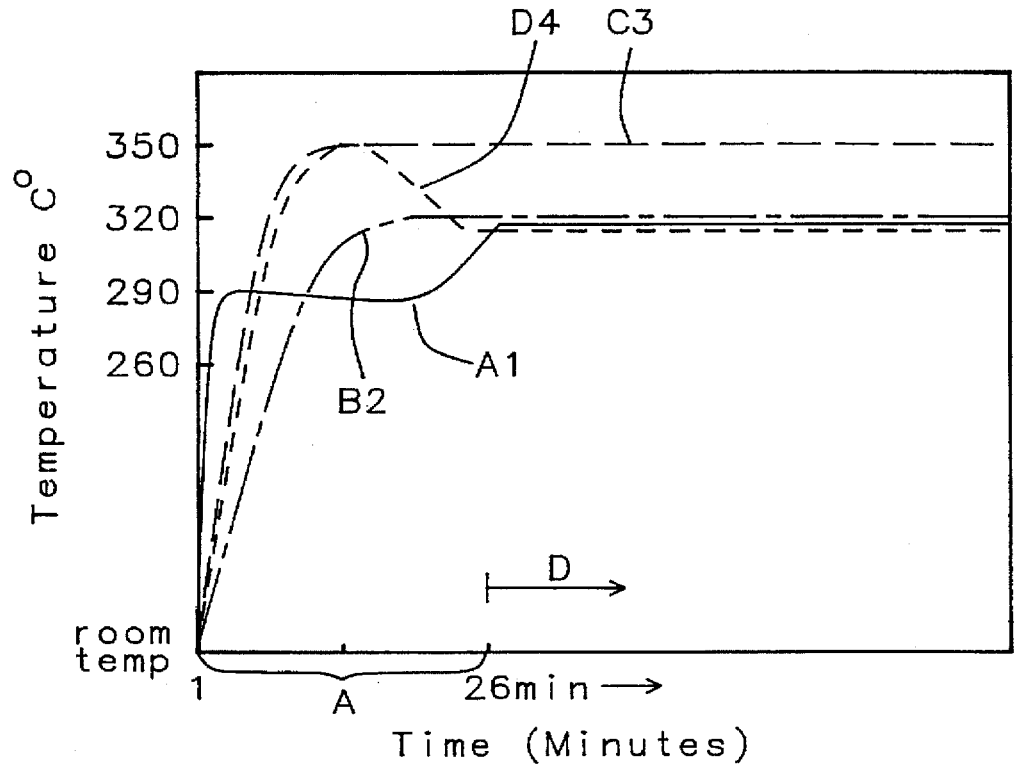
FIG. 4 is a graph of the temperature profiles of an experiment to minimize the voids in an aluminum alloy layer.

Metal voids as a function of PE-SiN Anneal temperature prior to SiN deposition - See FIG. 4.

| Split | Recipe Temperature - ramp up tem/dep. temp | metal void density |
|---|---|---|
| A-1 | temp.-290° C./320° C. | high density |
| B-2 | temp.-320° C./320° C. | high density |
| C-3 | temp.-350° C./350° C. | none |
| D-4* | temp.-350° C./320° C. | none |

*Process of the invention.

All these 4 split condition have the same total pre-deposition thermal treatment time of about 20 minutes.

Figure 3:
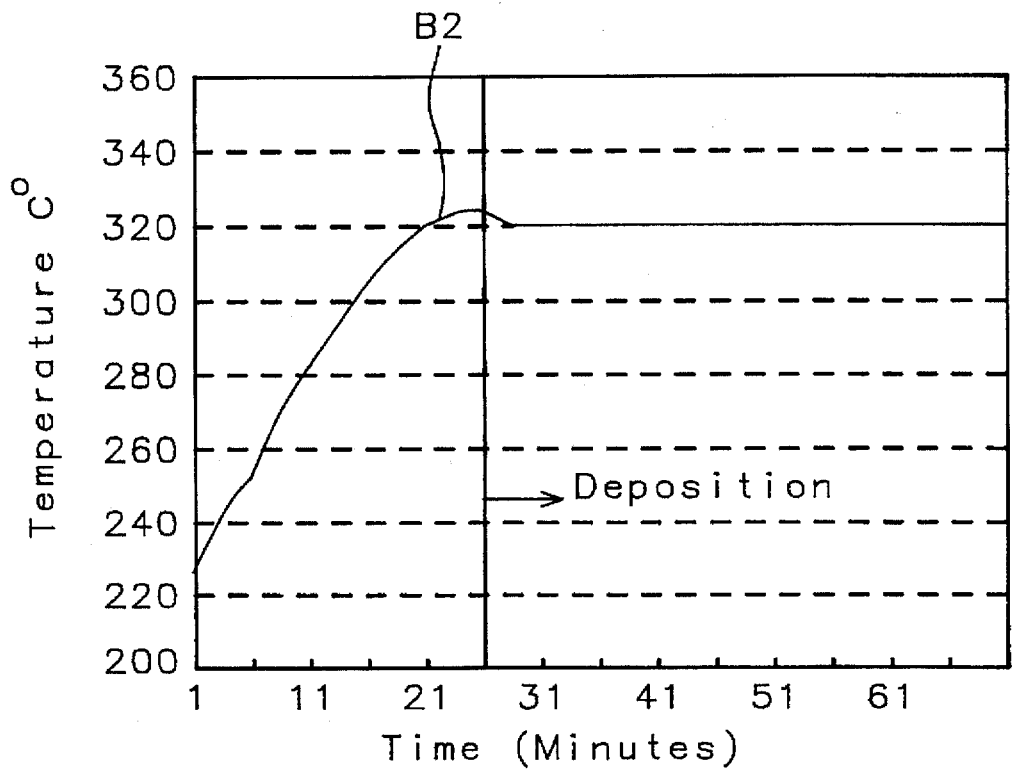
FIG. 3 is a graph of a temperature profile which created metal voids in the aluminum layer.

FIGS. 2, 3 and 4 show the thermal cycles used for the 4 splits. Line A1 on FIG. 4, represents split A1 in table 1. Line B2 on FIG. 3 and FIG. 4 represents split B2 in Table 1. Line C3 in FIG. 4 represents split C3. Line D4 in FIGS. 2 and 4 represent split D4 in table 1. "A" represents the ramp up and anneal time on FIG. 4. Also, "D" represents the deposit time.

Table 1 and FIG. 4 show that the metal void problem is greatly reduced by thermally treating (e.g., pre-annealing) the wafers at a temperature of about 350° C. and ramping down to about 320° C. for the PE-SiN deposition. The cooling from 350° C. immediately prior to SiN deposition reduces the stress on the aluminum alloy layer 20, as shown in FIG. 5, which reduce the voids. In FIG. 5, the stress as a function of temperature for cooling is shown in line C and for heating up in line H.

It should be will understood by one skilled in the art that by including additional process steps not described in this embodiment, other layers can also be included on the chip. For example, P wells in the P substrate and CMOS circuit can be formed therefrom. Also, additional insulating and conductive layers not shown can be formed on the wafer surface, such as oxide layers and polysilicon layers. Also, the term "substrate surface" means the upper most layer over a wafer. For example in FIG. 1, the layer 20 is formed on the substrate surface, the substrate surface comprising layer 18 16 14 12 and 10.

While the invention has been particularly shown and described with reference to the preferred embodiments thereof, it will be understood by those skilled in the art that various changes in form and details may be made without departing from the spirit and scope of the invention.

What is claimed is:

1. A method of forming a void free, reduced stress aluminum layer and an overlying nitride layer on a substrate, comprising:
   a) forming an aluminum alloy layer over a substrate surface;
   b) forming a silicon nitride layer over said aluminum alloy layer by ramping said substrate from room temperature up to between about 345° and 355° C.; and ramping the temperature down to a temperature between 315° and 325° C. and depositing silicon nitride over said aluminum alloy layer at a temperature of between about 315° and 325° C.

2. The method of claim 1 wherein said aluminum alloy layer has a composition of between 98 to 99.5 weight % Al, and 0.5 to 2.0 weight % Si.

3. The method of claim 1 wherein said aluminum alloy layer is sputter deposited from a single target containing Al and Silicon, at an energy of between about 9.5 and 10.0 kW, at a wafer temperature of between about 150° and 160° C., gas ambient of Argon and at a pressure of between about 1E-3 to 6E-3 torr, voltage range between 480 and 650 V and a DC power supply.

4. The method of claim 1 wherein step (b), the ramping from room temperature is performed at a pressure between about 2200 and 2500 mtorr and in a $N_2$ ambient, for a time between about 3 and 8 minutes and the depositing of silicon nitride is performed using a PECVD process at a pressure in a range between 2200 and 2500 mtorr.

5. The method of claim 1 which further includes before step (a) forming a gate oxide layer over a wafer, forming a polysilicon layer over said gate oxide layer and forming a polyoxide layer over said polysilicon layer and forming a first insulating layer composed of silicon nitride layer over said polyoxide layer, said first insulating layer comprising said substrate surface.

6. The method of claim 5 wherein said polysilicon layer has a thickness in a range of between about 2900 and 3400 Å.

7. The method of claim 5 wherein said polyoxide layer has a thickness in a range of between about 220 and 280 Å.

8. The method of claim 5 wherein said first insulating layer composed of silicon nitride is formed using a LPCVD process by reacting dichlorosilane and ammonia at reduced pressure of between about 200 and 300 mtorr and at a temperature between about 730° and 830° C.

9. The method of claim 1 wherein step (b) is performed at a pressure between about 2200 and 2500 m torr, in a $N_2$ ambient.

10. A method of forming a void free aluminum structure on a substrate comprising:
    a) forming a first insulating layer composed of silicon nitride layer over a substrate surface;
    b) forming an aluminum alloy layer over said first insulating layer;
    c) forming a silicon nitride layer over said aluminum layer by ramping the substrate from room temperature up to between about 345° and 355° C., at a pressure between about 2200 and 2500 m torr, in a $N_2$ ambient, for time of between about 3 and 5 minutes; and ramping the temperature down to between 315° and 325° C. and depositing silicon nitride over said aluminum layer at a temperature of between about 315° and 325° C.

11. The method of claim 10 which further includes before step (a) forming a gate oxide layer over said substrate, forming a polysilicon layer over said gate oxide layer and forming a polyoxide layer over said polysilicon layer.

12. The method of claim 10 wherein said aluminum alloy layer has a composition of between 98 to 99.5 weight % Al, 0.5 to 2.0 weight % Si.

13. The method of claim 10 wherein said aluminum alloy layer is sputter deposited from a single target containing Al and Silicon, at an energy of between about 9.5 and 10.0 kW, at a wafer temperature of between about 150° and 160° C., gas ambient of Argon and at a pressure of between about 1E-3 to 6E-3 torr, voltage range between 480 and 650 V and a DC power supply.

14. The method of claim 11 wherein said polysilicon layer has a thickness in a range of between about 2900 and 3400 Å.

15. The method of claim 11 wherein said polyoxide layer has a thickness in a range of between about 220 and 280 Å.

16. The method of claim 10 wherein said first insulating layer composed of silicon nitride is formed using a LPCVD process by reacting dichlorosilane and ammonia at reduced pressure of between about 200 and 300 mtorr and at a temperature between about 730° and 830° C.

17. A method of forming a void free, reduced stress aluminum layer and an overlying silicon nitride layer over a wafer, comprising:

a) forming a gate oxide layer over said wafer;
   b) forming a polysilicon layer over said gate oxide layer;
   c) forming a polyoxide layer over said polysilicon layer;
   d) forming a first insulating layer composed of silicon nitride over said polyoxide layer;
   e) forming an aluminum alloy layer over said first insulating layer;
   f) forming a silicon nitride layer over said aluminum alloy layer by ramping said substrate from room temperature up to between about 345° and 355° C., at a pressure between about 2200 to 2500 m torr, in a $N_2$ ambient, for time of between about 3 and 8 minutes; and ramping the temperature down to between 315° and 325° C. and depositing silicon nitride over said aluminum alloy layer at a temperature of between about 315° and 325° C.

18. The method of claim 17 wherein said aluminum alloy layer has a composition of between 98 to 99.5 weight % Al, 0.5 to 2.0 weight % Si.

19. The method of claim 17 wherein said aluminum alloy layer is sputter deposited from a single target containing Al and Silicon, at an energy of between about 9.5 and 10.0 kW, at a wafer temperature of between about 150° and 160° C., gas ambient of Argon and at a pressure of between about 1E-3 to 6E-3 torr, voltage range between 480 and 650 V and a DC power supply.

20. The method of claim 17 wherein said polysilicon layer has a thickness in a range of between about 2900 and 3400 Å.

21. The method of claim 17 wherein said polyoxide layer 16 has a thickness in a range of between about 220 and 280 Å.

22. The method of claim 17 wherein said first insulating layer composed of silicon nitride is formed using a LPCVD process by reacting dichlorosilane and ammonia at reduced pressure of between about 200 and 300 mtorr and at a temperature between about 730° and 830° C.

23. A method of forming a void free, reduced stress aluminum layer and an overlying nitride layer on a substrate, comprising:

a) forming an aluminum alloy layer over a substrate surface;
   b) forming a silicon nitride layer over said aluminum alloy layer by ramping said substrate from room temperature up to between about 345° and 355° C.; the ramping from room temperature is performed at a pressure between about 2200 and 2500 mtorr and in a $N_2$ ambient, for a time between about 3 and 8 minutes and ramping the temperature down to a temperature between 315° and 325° C. and depositing silicon nitride over said aluminum alloy layer at a temperature of between about 315° and 325° C. and the depositing of silicon nitride is performed using a PECVD process at a pressure in a range between 2200 and 2500 mtorr.

24. A method of forming a void free, reduced stress aluminum layer and an overlying nitride layer on a substrate, comprising:

(a) forming an aluminum alloy layer over a substrate surface;
   (b) forming a silicon nitride layer over said aluminum alloy layer, at a pressure between about 2200 and 2500 m torr, in a $N_2$ ambient, by ramping said substrate from room temperature up to between about 345° and 355° C.; and ramping the temperature down to a temperature between 315° and 325° C. and depositing silicon nitride over said aluminum alloy layer at a temperature of between about 315° and 325° C.

25. A method of forming a void free, reduced stress aluminum layer and an overlying nitride layer on a substrate, comprising:

(a) forming an aluminum alloy layer over a substrate surface;
   (b) forming a silicon nitride layer over said aluminum alloy layer by ramping said substrate from room temperature up to between about 345° and 355° C.; and ramping the temperature down to a temperature between 315° and 325° C. and depositing silicon nitride over said aluminum alloy layer at a temperature of between about 315° and 325° C.

* * * * *